(12) United States Patent
Behringer et al.

(10) Patent No.: US 9,234,922 B2
(45) Date of Patent: Jan. 12, 2016

(54) MEASURING SYSTEM FOR MONITORING AT LEAST ONE PHASE OF A SYSTEM

(75) Inventors: Klaus Behringer, Igensdorf (DE); Martin Meinke, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 177 days.

(21) Appl. No.: 13/883,214

(22) PCT Filed: Oct. 27, 2011

(86) PCT No.: PCT/EP2011/068880
§ 371 (c)(1),
(2), (4) Date: May 2, 2013

(87) PCT Pub. No.: WO2012/059398
PCT Pub. Date: May 10, 2012

(65) Prior Publication Data
US 2013/0229192 A1 Sep. 5, 2013

(30) Foreign Application Priority Data
Nov. 3, 2010 (DE) .................. 10 2010 043 254

(51) Int. Cl.
*G01R 21/06* (2006.01)
*G01R 11/02* (2006.01)
(Continued)

(52) U.S. Cl.
CPC .............. *G01R 21/06* (2013.01); *G01R 11/02* (2013.01); *G01R 21/133* (2013.01); *G01R 15/207* (2013.01)

(58) Field of Classification Search
CPC .. G01R 21/133; G01R 22/00; G01R 19/2513; G01R 22/10; G01R 22/063; G01R 21/06; G01R 31/086; G01R 35/04; G01R 21/00; G01R 21/001; G01R 21/005; G01R 31/085; G01R 11/02; G01R 15/207; H02M 3/156; G01D 4/00; G01D 4/002; G01D 4/008; H04B 5/0037; H04Q 2209/60; G06F 1/3203; H04W 24/00
See application file for complete search history.

(56) References Cited

U.S. PATENT DOCUMENTS 5,041,780 A 8/1991 Rippel
5,903,145 A * 5/1999 Hemminger et al. ......... 324/142
(Continued)

FOREIGN PATENT DOCUMENTS

DE 198 19 470 A1 7/1999
DE 198 42 241 A1 4/2000
WO WO 2010/007369 A2 1/2010

OTHER PUBLICATIONS
German Search Report for PCT/EP2011/068880 dated Feb. 12, 2013.
(Continued)

*Primary Examiner* — Vinh Nguyen
(74) *Attorney, Agent, or Firm* — Harness, Dickey & Pierce, P.L.C.

(57) ABSTRACT

A measuring system is disclosed for monitoring at least one phase of a system. A measuring module includes a signal acquisition module and a signal further processing module. The signal acquisition module is formed by an ASIC. A printed circuit board includes a voltage sensor and the signal acquisition module includes current sensors and a voltage sensor connection connected to the voltage sensor in an electrically conductive manner, for each phase to be monitored. The signal further processing module is connected to the signal acquisition module and can evaluate current and voltage values which have been determined. The signal further processing module includes, output devices which can be used to output serial data and digital signals for control purposes.

19 Claims, 3 Drawing Sheets

(51) Int. Cl.
*G01R 21/133* (2006.01)
*G01R 15/20* (2006.01)

(56) References Cited

U.S. PATENT DOCUMENTS

| | | | |
|---|---|---|---|
| 6,275,021 B1 * | 8/2001 | Windsheimer | 324/142 |
| 6,483,285 B2 * | 11/2002 | Widmer et al. | 324/74 |
| 6,555,997 B1 | 4/2003 | De Vries et al. | |
| 2003/0011355 A1 | 1/2003 | Crosier | |
| 2004/0155644 A1 | 8/2004 | Dickinson | |
| 2004/0172207 A1 | 9/2004 | Forth | |
| 2006/0033487 A1 | 2/2006 | Ishibashi | |
| 2006/0052958 A1 | 3/2006 | Forth | |
| 2009/0319210 A1 | 12/2009 | Yanagisawa | |
| 2010/0156394 A1 | 6/2010 | Ausserlechner et al. | |
| 2010/0235122 A1 | 9/2010 | Bitsch | |
| 2011/0153246 A1 | 6/2011 | Donaldson et al. | |

OTHER PUBLICATIONS

International Search Report for PCT/EP2011/068880 dated Feb. 6, 2012.
German Office Action for DE 10 2012 043 254.7 dated Jun. 22, 2011.
German Written Opinion for PCT/EP2011/068880 dated Dec. 19, 2012.

* cited by examiner

MEASURING SYSTEM FOR MONITORING AT LEAST ONE PHASE OF A SYSTEM

PRIORITY STATEMENT

This application is the national phase under 35 U.S.C. §371 of PCT International Application No. PCT/EP2011/068880 which has an International filing date of Oct. 27, 2011, which designated the United States of America and which claims priority to German patent application number DE 10 2010 043254.7 filed Nov. 3, 2010, the entire contents of each of which are hereby incorporated herein by reference.

FIELD

At least one embodiment of the invention generally relates to a measuring system for monitoring at least one phase of a system, in particular a load feeder.

BACKGROUND

Increasing environmental awareness has led to demands to avoid wasting energy in industrial installations and also, in particular, to use electrical energy efficiently. The "energy management" necessary for this purpose requires as its input variable the detailed monitoring of how energy is distributed within the installation. The flows of energy to the individual loads are of particular interest in this case. Energy is usually fed to the individual loads over a single lead (one phase) or three leads (three phases) depending on whether the load is a single-phase or three-phase one.

Three-phase motors are the principal energy converters in machine installations having turning parts. Said three-phase motors are supplied with energy via control and protective gear usually over spur lines. The three-phase motor connected to the control and protective gear is moreover controlled and monitored by it. The term used for the combination of control and protective gear is "load feeder". Fuseless load feeders are for example device combinations consisting of a contactor for operational switching and a power circuit-breaker for overload and short-circuit protection.

A three-phase motor is usually supplied with electrical energy over three leads (phases). The leads (phases) are routed to the installation via the load feeder so that the desired control and monitoring of the installation can be performed by the load feeder.

In particular the following factors are of significance for optimizing the consumption values of an installation (e.g. a three-phase motor):
transparent measuring of the energy distribution (effective power, apparent power, reactive power) in the installation,
providing information about the respective load status of the individual load feeders,
initiating control measures (on a central/decentralized basis) for optimizing load feeder efficiency so that the energy efficiency of the installation will be increased.

Where the control measures are concerned a distinction must be made between (as a rule time-critical, decentralized) efficiency-optimizing closed-loop control processes in the individual feeder (torque control, for example) and energy management control processes conducted centrally by a higher-level control system, for example disconnecting and connecting individual load feeders as a function of the capacity utilization level.

However, fast acquisition of the respective load status in the individual load feeders is the foremost prerequisite for effective energy management.

The phase angle between current and voltage (Cos Phi/cos φ) has proved to be the best characteristic variable for the load status of a motor-driven load feeder. However, since said characteristic variable does not produce clear results across all operating ranges of a motor the respectively associated operating current must be additionally assessed at the same time.

Load feeders are furthermore expected to check the operating condition of the connected installation (condition monitoring) by monitoring how the electric characteristic variables change over time. A distinction has to be made here between long-term changes in behavior (due to wear and tear, for example) and short-term changes in behavior (for example dry-running of pumps, fan belt disengagement in transmission systems, airflow blocking in ventilators). Long-term changes in behavior can be detected using trend analyses (of current consumption, for example). The detection of short-term changes in behavior by contrast requires fast evaluation of measured values. Monitoring the cos φ in conjunction with assessment of the associated operating current has proved to be a useful characteristic variable for detecting short-term changes in behavior also in checking the operating condition (in condition monitoring).

Load feeders also have to be protected against overloading and short-circuits. Overload protection can be ensured by way of electronically simulating motor heating (motor model) using the time characteristic curve of the motor current. What, conversely, is required for the one "electronic" short-circuit protection is extremely fast threshold monitoring of the motor current (required reaction time=10 μs).

For acquisition and evaluation of the necessary measured values needed within the process of optimizing the consumption values of an installation, checking the operating condition, and protecting against overload and short-circuits, what have hitherto been required in a load feeder, particularly a three-phase load feeder, are expensive electronic circuits (analog technology+digital technology) consisting of a multiplicity of components.

SUMMARY

At least one embodiment of the present invention provides a compact and versatile measuring system for determining current and voltage values of at least one phase.

A load feeder preferably includes the measuring system so that it will in particular be possible to carry out an analysis with regard to optimizing an installation connected to the load feeder, to check the operating condition of the installation, and to perform monitoring with regard to an overload or short-circuit of the installation.

The measuring system ought moreover preferably to be cost-optimized compared with conventional measuring module solutions.

The measuring system should preferably be able to acquire and evaluate single-phase and/or three-phase current and voltage values.

A device is disclosed, particularly a measuring system for monitoring at least one phase of a system, in particular a load feeder, including a measuring module arranged on a printed circuit board, wherein the measuring module includes a signal acquisition component and a signal further-processing component and the signal acquisition component is embodied by way of an ASIC, wherein—for each phase requiring to be monitored—the printed circuit board includes a voltage sensor and the signal acquisition component includes current sensors and a voltage sensor terminal connected to the voltage sensor in an electrically conducting manner, wherein a current value can be determined via the current sensors and a voltage value of the phase requiring to be monitored can be determined via the voltage sensor, wherein the signal further-processing component is connected to the signal acquisition component and can evaluate determined current and voltage values, wherein the signal further-processing component includes at least one output device by which serial data and digital signals can be output for control purposes. Advantageous developments of the invention are described in the dependent claims.

The system is preferably a load feeder that includes the at least one phase. The at least one phase serves preferably to supply energy to an installation connected to the load feeder or it mirrors a value characterizing the supply of energy to the installation connected to the load feeder.

The corresponding current value, i.e. a value characterizing the current of the corresponding phase, of the phase (lead) or phases (leads) requiring to be monitored can be determined by way of the current sensors. When a plurality of phases are being monitored then preferably individual current sensors can serve to determine a current value of a plurality of phases. In particular at least two current sensors are needed for determining a current value of one phase.

The voltage sensor or sensors (when a plurality of phases are being monitored) can be connected to the signal acquisition component via the voltage sensor terminal. In this case a voltage sensor and a voltage sensor terminal are preferably provided for each phase requiring to be monitored, with the voltage sensor being connected to the associated voltage sensor terminal in an electrically conducting manner. The corresponding voltage value, i.e. a value characterizing the voltage of the phase, of the phase (lead) or phases (leads) requiring to be monitored can be determined by the voltage sensor(s). The voltage sensor is preferably a capacitive voltage sensor. An electrically isolated capacitive voltage measurement can be performed on a multi-conductor system by a plurality of capacitive voltage sensors integrated in the printed circuit board. No MEMS (MEMS=Micro-Electro-Mechanical System) structures are used therefor. The voltage value of the phase requiring to be monitored can thus be fed to the signal acquisition component by the voltage sensor by way of the associated voltage sensor terminal.

Serial data, in particular current, voltage, performance and diagnostic values, and digital signals for control purposes, in particular signals that characterize a short-circuit, an overload and a current and voltage phase zero crossing in terms of the at least one phase being monitored can be output via the output device. The output device has preferably in each case a value-/signal-specific terminal for outputting the serial data and/or digital signals.

An installation connected to the system is supplied with energy preferably via the system's at least one phase. A compact measuring system by which optimal monitoring of at least one phase of the system is made possible is provided by the inventive measuring system. In particular the system's relevant current and voltage values can be determined by the measuring system via the at least one monitored phase. Further important data can be determined based on an evaluation of the time characteristic curves of the current and/or voltage values. The current and voltage phase zero crossings can preferably be determined by the measuring system in terms of the monitored phase(s). Both open- and closed-loop control processes within energy management and condition monitoring and motor protection (overload protection, short-circuit protection) in terms of the installation being supplied with energy by the at least one phase can in that way be realized by way of just one measuring system. Preferably performance-related data such as, for example, effective power, apparent power, reactive power, and/or the Cos Phi (cos φ) in terms of the at least one phase being monitored can furthermore be output via the measuring system. The inventive measuring system offers a broad range of applications making it versatile in its use so that a product-specific measuring module solution will not be required. Extremely fast current-limit monitoring with an associated output of signals is in particular made possible by the measuring system, enabling a reaction time of approximately 10 μs. Extremely fast Cos Phi calculation is possible thanks to the detection of the current and voltage phase zero crossings that is integrated in the measuring system and an associated digital signal output exhibiting phase-angle accuracy.

The current and voltage values are preferably analyzed in the signal further-processing component which preferably includes a microcontroller. The two-part structure furthermore enables the measuring module to be optimally matched to the respective application. The signal further-processing component can be selected in accordance with the specific application and finally coupled to the signal acquisition component. The analog part of the measuring module (signal acquisition component) can hence be combined with various efficient and powerful digital signal further-processing components.

In an advantageous embodiment variant of the invention the system is connected upstream of an installation and the at least one phase that is "looped" through the system serves to supply the downstream installation with energy or mirrors supplying the downstream installation with energy. The system is for example a load feeder that is connected upstream of the installation such as, for instance, an electric motor. The at least one phase and, thereby, the downstream installation can be monitored by the measuring system integrated in the system (in the load feeder). Alternatively thereto it is also conceivable for the system to be an end consumer (an installation) such as e.g. an electric motor. The at least one phase requiring to be monitored consequently serves directly to supply the system with energy so that the system will be directly monitored and analyzed by the measuring system.

In another advantageous embodiment variant of the invention the current sensors are embodied by current-measuring Hall-effect sensors integrated in the ASIC.

In another advantageous embodiment variant of the invention the at least one voltage sensor is arranged outside the area of the printed circuit board covered by the signal acquisition component. In the plan view onto the signal acquisition component and printed circuit board the voltage sensor is therefore disposed outside the area of the printed circuit board covered by the signal acquisition component so that it is not covered by the surface area of the signal acquisition component. A straight line that is taken through the voltage sensor and oriented orthogonally to the printed circuit board will therefore not intersect the signal acquisition component. In particular a structural design that is an improvement in manufacturing and connectivity terms can be facilitated in this way. The at least one voltage sensor is connected in each case to the associated voltage sensor terminal. Flexible phase routing is made possible as a result of the voltage sensor being disposed outside the area of the printed circuit board covered by the signal acquisition component makes. The voltage sensor has only to be positioned within the region of its phase requiring to be monitored so that the voltage value of the phase can be determined. Said voltage value can be fed to the signal acquisition component over the electrically conducting link between the voltage sensor and signal acquisition component. A spatial distance can in that way be established between the at least one voltage sensor and the current sensors so that they will not interfere with one another. The current sensors and at least one voltage sensor are thus arranged such that a current and voltage value in terms of the at least one phase can be determined.

In another advantageous embodiment variant of the invention the at least one voltage sensor is arranged inside the printed circuit board. The at least one voltage sensor will consequently be enclosed within the printed circuit board. An extremely compact measuring system can be realized in this way. Integrating the at least one voltage sensor inside the printed circuit board will moreover enable the coupling of the at least one voltage sensor to the at least one phase and to the signal acquisition component to be optimized.

In another advantageous embodiment variant of the invention the voltage sensor is a capacitive voltage sensor.

In another advantageous embodiment variant of the invention the at least one phase requiring to be monitored of the system requiring to be monitored is in each case electrically isolated from its current sensors and voltage sensor terminal, in particular its voltage sensor. The requirements placed on the safety of the measuring system can be met in this way.

In another advantageous embodiment variant of the invention, the measuring system is embodied for monitoring an at least three-phase system. Current sensors embodied by the ASIC and a voltage sensor terminal as well as a voltage sensor are preferably provided for each phase when a multi-conductor system is being monitored. The output device furthermore preferably has in each case a separate output for phase-specific values/signals.

When a three-phase system (a system having three leads) is being monitored the measuring system will necessarily include at least four current sensors, three voltage sensor terminals and three voltage sensors so that current measuring and voltage measuring can be performed via them on the multi-conductor system. Each individual voltage sensor terminal from among the voltage sensor terminals is connected to its associated phase-specific voltage sensor. Consequently at least three voltage sensors will have been mounted on or integrated in the printed circuit board. The individual current and/or voltage sensors are preferably able to be deactivated. If, for example, only one phase is being monitored by way of the measuring system, which is capable of monitoring a plurality of phases, then the unused current sensors and voltage sensors can be deactivated.

When a plurality of phases are being monitored by way of the measuring system, the phases which in a plan view onto the signal acquisition component and printed circuit board are in the region of the signal acquisition component are preferably routed in a bundled manner and those outside the signal acquisition component are preferably routed spaced further apart from one another inside the printed circuit board or inside an insulating block.

In another advantageous embodiment variant of the invention the measuring module, in particular the signal acquisition component, includes at least one connecting device for connecting an external current sensor for determining a current value of the at least one phase of the system. The measuring module preferably has a plurality of connecting device so that there will be a connecting device for each of the phases of the system that are to be monitored. An external current sensor for determining the current such as, for example, a current transformer, a Rogowski coil or a shunt can be coupled to the signal acquisition component via the connecting device.

The possibility of coupling an external voltage sensor to the measuring module and in particular the signal acquisition component for each phase is also conceivable so there will be an alternative possibility for voltage measurement for each phase.

Current measurement and/or voltage measurement by way of external current sensors and/or the external voltage sensor (or the external voltage sensors when there are a plurality of phases requiring to be monitored) can be facilitated in that way. As a result the measuring module can be used for current and voltage measurements in other current and voltage ranges. Preferably a plurality of connecting places for the external current sensors and/or external voltage sensors will be formed by the connecting device so that a multi-conductor system, in particular a three-phase system, can be monitored purely by the external current and/or external voltage sensors.

The current value and/or voltage value of the leads requiring to be monitored can consequently be completely determined via the external current sensors and/or external voltage sensors if the nominal currents exceed a magnitude that can no longer be registered by the "internal" current sensors and/or voltage sensors. It is preferably possible for the unused current sensors disposed in the ASIC and/or the unused voltage sensors integrated in the printed circuit board to be deactivated when monitoring is by way of the external current sensors and/or external voltage sensors. The measuring system's "internal" current sensors and/or voltage sensors are preferably dimensioned for nominal currents up to approximately 20 amperes. The measuring system can consequently be used also for nominal currents>20 amperes through the coupling of external current and voltage sensors to the measuring system. The measuring system can in that way be used in an extremely versatile manner.

It is also conceivable for the at least one phase of the system requiring to be monitored to be mapped in each case by way of a voltage divider and ultimately to be evaluated by the associated voltage sensor of the measuring system. The phase requiring to be monitored can ultimately be mapped via a conductor potential phase provided by the voltage divider and routed to the voltage sensor.

In another advantageous embodiment variant of the invention the measuring module is able to determine the power factor ($\cos \phi$), the effective power, the apparent power, the reactive power and/or a value characterizing the power factor, the effective power, the apparent power and/or the reactive power in terms of the at least one phase and can output same via the output device. The installation being supplied with energy by the at least one phase can be monitored and analyzed on the basis of the values.

In another advantageous embodiment variant of the invention the signal further-processing component is able on the basis of the determined current and/or voltage values to determine an overload and/or a short-circuit of an installation being supplied via the at least one phase and a signal characterizing the overload and/or short-circuit can be output via the output device.

The current and voltage phase zero crossings can furthermore preferably be determined by the measuring system.

In another advantageous embodiment variant of the invention the ASIC furthermore includes the signal further-processing component. A particularly economical measuring system can be realized in that way.

In another advantageous embodiment variant of the invention the measuring module, in particular the signal acquisition component, can be parameterized via parameterizing device, in particular parameter pins and/or a serial interface. Preferably in particular a behavioral mode of the measuring module in terms of thresholds of the currents and voltages requiring to be monitored, a choice of sensors and/or a number of phases can be set via the parameterizing device. A measuring system which can monitor, for instance, three phases can, for example, be set via the parameterizing device such that only the current sensors and voltage sensor of one phase are active and the other current and voltage sensors are deactivated.

In an advantageous embodiment variant of the invention the at least one phase is formed in each case by a conductor potential phase. By way of a voltage divider for example a reduced voltage is fed to the measuring system via the conductor potential phase so that the installation requiring to be monitored can be monitored by analyzing the conductor potential phase. The conductor potential phase consequently mirrors the actual supply lead of the load requiring to be monitored.

In another advantageous embodiment variant of the invention the at least one phase is routed in the printed circuit board and the signal acquisition component is positioned on the printed circuit board in such a way that the at least one phase is routed beneath the signal acquisition component. The area of the printed circuit board covered by the signal acquisition component consequently contains the at least one phase. A straight line that is taken through the phase and oriented orthogonally to the printed circuit board can therefore intersect the signal acquisition component.

With reference to the voltage sensor a straight line that is taken through the phase and oriented orthogonally to the printed circuit board can preferably intersect a part of the voltage sensor that monitors the phase.

In another advantageous embodiment variant of the invention the measuring system includes an insulating block in which the at least one phase is routed, wherein the printed circuit board has a first and a second lateral surface, wherein the first lateral surface is disposed opposite the second lateral surface, wherein the signal acquisition component is disposed on the first lateral surface and the insulating block is disposed on the second lateral surface, wherein the signal acquisition component is positioned opposite the insulating block on the printed circuit board in such a way that the at least one phase is routed beneath the signal acquisition component. A straight line that is taken through the phase and oriented orthogonally to the second lateral surface of the printed circuit board and/or to the insulating block will consequently be able to intersect the signal acquisition component. Because the phase is integrated in an insulating block, a system which is supplied with high-level currents can be monitored and analyzed just as safely so that no damage can be caused to the printed circuit board or other components.

In another advantageous embodiment variant of the invention the first lateral surface has a recess so that the signal acquisition component is integrated at least partially in the printed circuit board. The lateral surfaces of the signal acquisition component that are oriented orthogonally to the printed circuit board are framed at least partially by the printed circuit board. The signal acquisition component is consequently inset into a deep-milled region of the printed circuit board. The signal acquisition component with the lateral surface directed toward the printed circuit board is preferably positioned completely in the recess in the printed circuit board. The distance between the current sensors and the phase(s) requiring to be monitored will in that way be kept as small as possible so that current measuring can be improved. It is also conceivable that when phase routing takes place inside the printed circuit board said board can have a recess for the signal acquisition component.

In another advantageous embodiment variant of the invention a load feeder includes the measuring system, wherein it is possible to monitor at least one phase of the load feeder by way of the measuring system. The load feeder is the system having the at least one phase and being monitored by the measuring system. The load feeder's at least one phase ultimately represents the phase of an installation connected to the load feeder so that the installation will be monitored through the monitoring of the at least one phase of the load feeder.

BRIEF DESCRIPTION OF THE DRAWINGS

The invention and embodiments of the invention are described and explained in more detail below with reference to the example embodiments shown in the figures, in which.

DETAILED DESCRIPTION OF THE EXAMPLE EMBODIMENTS

Figure 1:
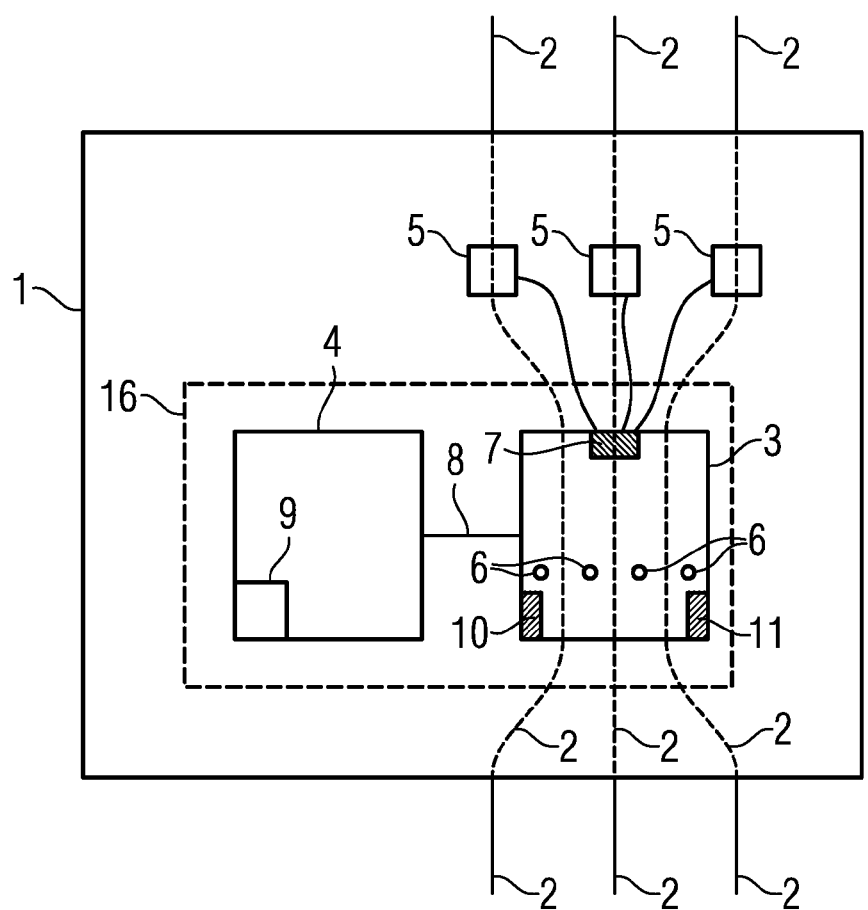
FIG. 1 is a schematic of a plan view onto a measuring system by which three phases of a system can be monitored.

FIG. 1 is a schematic of a plan view onto a measuring system 1 by which three phases 2 of a system can be monitored. The system is therein a load feeder through which three phases 2 serving to supply an installation connected to the load feeder with energy are routed. The three phases 2 of the load feeder ultimately mirror the energy supply leads of the installation connected to the load feeder so that the installation connected to the load feeder can ultimately be monitored through the monitoring of the load feeder's three phases 2. So that the three phases 2 can be monitored by the load feeder the three phases 2 of the load feeder are routed to the measuring system and monitored.

In this arrangement the measuring system is a constituent part of the load feeder by which the installation is monitored. The load feeder includes the inventive measuring system so that optimizing the installation's consumption values, checking its operating condition, and monitoring for an overload or a short-circuit of the installation can be performed by the load feeder. In particular current values, voltage values and the phase angle of individual phases 2 can be determined and ultimately evaluated with the aid of the measuring system. In particular serial data and digital signals can be output by the measuring system on the basis of the evaluation so that the desired monitoring of the installation can be realized by way of the measuring system and hence by way of the load feeder.

For that purpose the measuring system includes a measuring module 16 that includes the signal acquisition component 3 and the signal further-processing component 4, as well as a printed circuit board 1 on which preferably the signal acquisition component 3 and the signal further-processing component 4 are mounted. The signal acquisition component 3 and the signal further-processing component 4 are connected to each other in an electrically conducting manner via a connecting lead 8. Said connecting lead 8 can be embodied by way of the printed circuit board 1.

A system containing up to three phases 2 can be monitored by the measuring system illustrated. The printed circuit board 1 for that purpose includes three voltage sensors 5 integrated in the printed circuit board 1. The three voltage sensors 5 are preferably completely surrounded by the printed circuit board 1. Each phase 2 is assigned a voltage sensor 5, preferably a capacitive voltage sensor 5. In each case a voltage value of the associated phase 2 can consequently be determined by way of the voltage sensors 5. Each of the voltage sensors 5 is connected to the signal acquisition component 3 via the voltage sensor terminal 7 of the signal acquisition component 3. The signal acquisition component 3 includes four current sensors 6 by which a current value of the individual phases 2 can be determined. In each case two current sensors 6 are needed for determining the current value of a phase 2. The individual current sensors 6 are in particular current-measuring Hall-effect sensors 6.

The current value is in particular a value characterizing the current of the phase. The voltage value is in particular a value characterizing the voltage of the phase.

The three individual phases 2 are routed spaced further apart in the areas where they enter and exit the printed circuit board 1 compared with the region in which they are routed beneath the signal acquisition component 3 and in particular under the current sensors 6. The individual phases 2 are therefore routed in a mutually bundled manner in the region of the signal acquisition component 3 and in particular in the region of the current sensors 6. The individual phases 2 are therein routed directly inside the printed circuit board 1. The individual phases 2 can alternatively thereto also be routed beneath the printed circuit board 1 for example inside an insulating block. In the plan view onto the measuring system, the individual current sensors 6 are consequently arranged next to the individual phases 2, whereas the voltage sensors 5 each cover a phase 2. The phase 2 covered by the voltage sensor 5 is ultimately monitored by the voltage sensor 5.

The voltage sensors 5 are located outside the area covered by the signal acquisition component 3 in the printed circuit board 1. In FIG. 1 the phases 2 are already routed mutually further apart in said area than in the area of the current sensors 6. It is, though, also conceivable for the phases 2 to be spaced the same distance apart in the area of the voltage sensors 5 as the phases 2 in the area of the current sensors 6.

The signal acquisition component 3 includes the current sensors 6, the voltage terminal 7 via which the voltage sensors 5 are coupled to the signal acquisition component 3, a connecting device 10 and a parameterizing device 11.

External current sensors such as e.g. a current transformer, a Rogowski coil or a shunt can be coupled to the signal acquisition component 3 via the connecting device 10. Current measurement as well as analysis outside the areas permitted for the internal current sensors 6 can as a result also be provided by the measuring system. The internal current sensors 6 can preferably be deactivated for that purpose. It is also conceivable for an external voltage measuring device to be able to be coupled to the measuring system so that the determined voltage values can then be analyzed via the measuring system.

In particular the signal acquisition component 3 and/or the signal further-processing component 4 can be parameterized via the parameterizing device 11. If, for example, only a single-phase system is being monitored, then the unused current and voltage sensors 5,6 can be deactivated preferably by the parameterizing device 11. The "internal" current sensors can likewise be deactivated preferably via the parameterizing device 11 if external current sensors are coupled to the signal acquisition component 3 and are used.

The signal acquisition component 3 is realized by way of an ASIC. Economic production and a reliable signal acquisition component 3 can be provided in that way.

The signal further-processing component 4 includes an output device 9 via which by way of serial data, in particular current, voltage, performance and diagnostic values, and by way of digital signals for control purposes, in particular signals that characterize a short-circuit, an overload and a current and voltage phase zero crossing in terms of the at least one phase 2 being monitored, can be output. The output device 9 preferably includes a separate output or separate outputs for the serial data and/or for the digital signals.

Through the monitoring of the three phases 2 it will hence be possible by way of the measuring system to determine and analyze all relevant values (current value, voltage value, Cos Phi) regarding the installation being monitored by the load feeder so that for the installation being monitored by the load feeder it will be possible to carry out an analysis with regard to optimizing said installation, to check the installation's operating condition, and to perform monitoring with regard to an overload or a short-circuit in the installation. An extremely broad range of applications can be covered by the measuring system and hence by the load feeder without the need to produce a measuring system or load feeders specific to a particular installation.

Because the current values and voltage values are further processed in the signal further-processing component 4, the signal acquisition component 3 can be coupled to a suitable signal further-processing component 4 in accordance with the specific performance requirements. Flexible deployment can be ensured thereby. The signal further-processing component 4 includes in particular a microcontroller that is dimensioned in accordance with the specific performance requirements. The two-part structure enables an extremely versatile measuring system to be provided by which it is possible to carry out an analysis with regard to optimizing an installation connected to the load feeder, to check the installation's operating condition, and to perform monitoring with regard to an overload or a short-circuit in the installation.

It is also conceivable for the signal further-processing component 4 and the signal acquisition component 3 to be realized as an ASIC chip.

Figure 2:
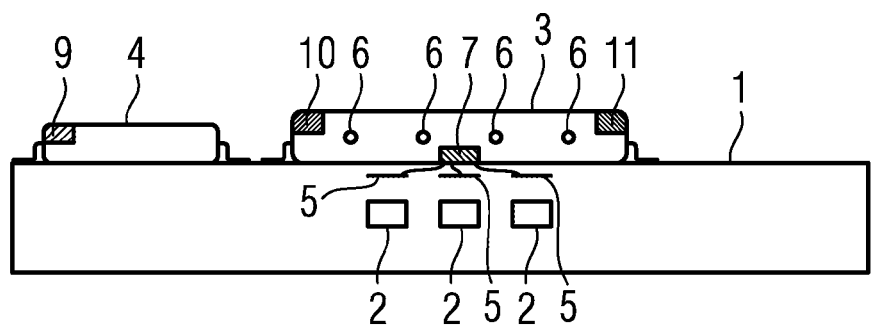
FIG. 2 is a schematic of a side view of an embodiment variant of a measuring system for monitoring three phases of a system.

FIG. 2 is a schematic of a side view of an embodiment variant of a measuring system for monitoring three phases 2 of a system. The system is therein preferably a load feeder, with an installation connected to the load feeder being monitored via the three phases 2 of the load feeder. The measuring system therein includes a measuring module, comprising a signal acquisition component 3 and a signal further-processing component 4, and a printed circuit board 1 in which three voltage sensors 5 are integrated.

The three phases 2 are in this example embodiment routed inside the printed circuit board 1. Also integrated inside the printed circuit board 1 are three capacitive voltage sensors 5 so that the voltage of a phase 2 can be determined by each voltage sensor 5. The signal acquisition component 3 and the signal further-processing component 4 are arranged on a lateral surface of the printed circuit board 1. The signal acquisition component 3 embodied as an ASIC chip is connected in an electrically conducting manner to the signal further-processing component 4.

The three voltage sensors 5 are arranged preferably outside the area of the printed circuit board 1 covered by the signal acquisition component 3 so that a voltage value can be determined with no interference.

The signal acquisition component 3 includes four current sensors 6, in particular four current-measuring Hall-effect sensors 6, a connecting device 10, a voltage sensor terminal 7, and a parameterizing device 11. A current value of the individual phases 2 can be determined by way of the current sensors 6. Two current sensors 6 are required for each phase 2 for determining the current value. External current sensors can be connected to the signal acquisition component 3 via the connecting device 10 so that a current value of the phases 2 requiring to be monitored can be determined via external current sensors. External current sensors can be, for example, current transformers, Rogowski coils or shunts by which a current value of the phase requiring to be analyzed can be determined. The signal acquisition component 3 can be parameterized via the parameterizing device 11 so that, for example, "internal" current sensors 6 can be activated or deactivated. For example, the "internal" current sensors 6 can be deactivated if a current value of the individual phases 2 is determined via the external current sensors. It is also preferably possible to activate or deactivate the individual current sensors 6 and the individual voltage sensors 5 as a function of the phases 2 requiring to be monitored. If, for instance, only one phase 2 is to be monitored then in each case two current and voltage sensors 5,6 can be deactivated via the parameterizing device 10 so that only the current and voltage sensor 5,6 of the phase requiring to be monitored will be active. The three voltage sensors 5 are preferably connected via pins to the signal acquisition component 3 by way of the voltage sensor terminal 7 so that the individual voltage values of the phases 2 can be fed to the signal acquisition component 3.

The three phases 2 are routed such that in each case one phase 2 is routed beneath a voltage sensor 5 likewise integrated in the printed circuit board 1 and centrally beneath two current sensors 6. Phase routing is preferably bundled in the region of the signal acquisition component 3. The individual phases 2 are therein routed to the measuring module and to the voltage sensors 5 in electrically isolated fashion.

The current and voltage values of the individual phases 2 can consequently be determined via the signal acquisition component 3. The $\cos \phi$ of the individual phases 2 can furthermore be determined using said data. Relevant values of the individual phases 2 that ultimately mirror the condition of the installation requiring to be monitored are consequently determined by the signal acquisition component 3. Said data is evaluated by the signal further-processing component 4 so that it will be possible to carry out an analysis with regard to optimizing an installation connected to the measuring system, to check the installation's operating condition, and to perform monitoring with regard to an overload or a short-circuit in the installation.

The signal further-processing component 4 includes output device enabling the output of serial data, in particular current, voltage, performance and diagnostic values, and digital signals for control purposes, in particular signals that characterize a short-circuit, an overload, and a current and voltage phase zero crossing in terms of the three phases 2 being monitored. A comprehensive analysis of the installation can consequently be carried out via the measuring system. On the basis of the determined current and voltage values, via the output device 9 the measuring module can determine and feed out the power factor ($\cos \phi$), the effective power, the apparent power, the reactive power and/or a value characterizing the power factor, the effective power, the apparent power and/or the reactive power in terms of the three phases 2.

For small nominal currents (up to approximately 6.0 A) the three phases 2 (conductors) of the load feeder's main power circuit requiring to be monitored are preferably routed inside the printed circuit board 1. The signal acquisition component 3 is positioned directly above the three phases 2. The usable current range is limited by the maximum available Cu thicknesses of the printed circuit board 1, the permissible short-time current-carrying capacity of the printed conductors in the event of a short circuit in conjunction with the respectively assigned short-circuit protection element (fuses, circuit breakers).

Current sensors 6 integrated in the ASIC (signal acquisition component 3) are used for the current measurement. Voltage measurement is effected by way of capacitive voltage sensors 5 arranged above the three phases 2 (conductors).

This structural variant constitutes what is generally the most economical solution because, for example, printed circuit boards 1 already present in electronic load feeders only need to be re-embodied accordingly.

Figure 3:
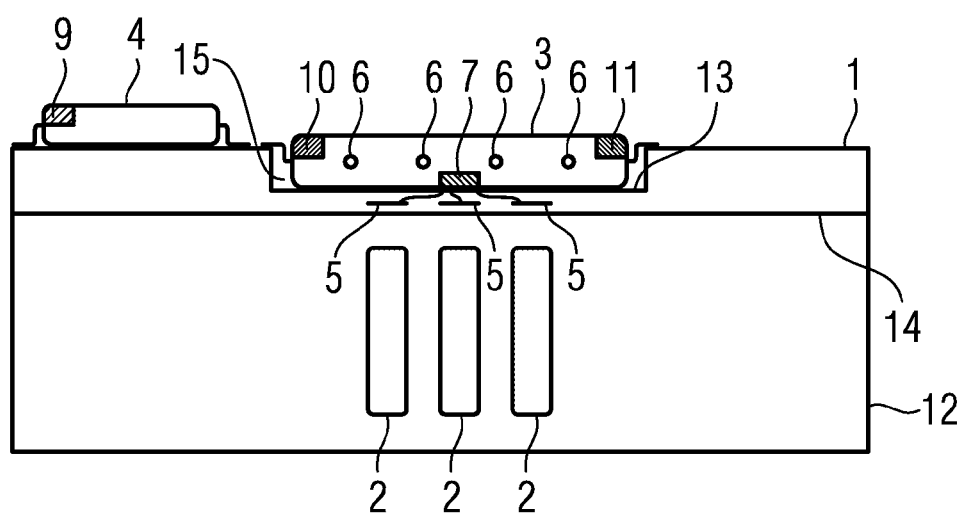
FIG. 3 is a schematic of a side view of another embodiment variant of a measuring system for monitoring three phases of a system.

FIG. 3 is a schematic of a side view of another embodiment variant of a measuring system for monitoring three phases 2 of a system. In contrast to FIG. 2 the three phases 2 are herein routed not in the printed circuit board 1 but in an insulating block 12. The printed circuit board 1 furthermore has a recess 15 in which the signal acquisition component 3 is positioned. The distance of the current sensors 6 from the three phases 2 is kept as small as possible thereby so that current measurement can be improved. The printed circuit board 1 has a first lateral surface 13 and a second lateral surface 14. The second lateral surface 14 directly adjoins the insulating block 12, whereas the signal acquisition component 3 and the signal further-processing component 4 are arranged on the first lateral surface 13. Routing the three phases 2 inside the insulating block 12 means that higher nominal currents can be analyzed.

Flat Cu conductors 2 (phases) cast in the insulating block 12 are preferably used for nominal currents of >3 A to approximately 40 A. The signal acquisition component 3 is inset into the deep-milled printed circuit board 1 which is mounted directly above the area of the insulating block 12 routing the three phases 2.

Voltage measuring is again effected by way of capacitive voltage sensors 5 disposed in the printed circuit board 1 and above the main power circuit conductors (phases 2).

Figure 4:
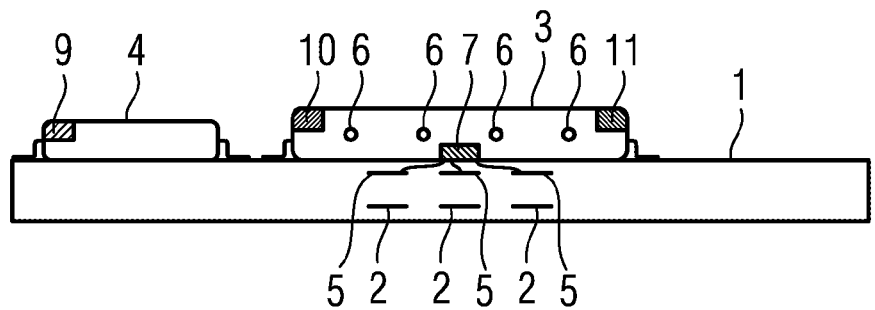
FIG. 4 is a schematic of a side view of another embodiment variant of a measuring system for monitoring three phases of a system.

FIG. 4 is a schematic of a side view of another embodiment variant of a measuring system for monitoring three phases 2 of a system. In contrast to FIG. 2, the three phases 2 are in this case fed to the measuring system by three conductor potential phases 2. By way of a voltage divider a reduced voltage is fed to the measuring system via the conductor potential phases 2 so that the installation requiring to be monitored can be monitored by analyzing the conductor potential phases 2. The conductor potential phases 2 consequently mirror the actual supply lead of the load requiring to be monitored. Furthermore, in this embodiment variant the current value of the individual phases is determined not via the current sensors 6 integrated in the signal acquisition component 3 but via external current sensors that are connected to the signal acquisition component 3 via the connecting device. The external current sensors determine the current value of the individual phases outside the signal acquisition component 3 and feed the determined current value to the signal acquisition component 3 via the connecting device 10. The internal current sensors 6 have preferably been deactivated in this case.

The sensor elements 6 integrated in the ASIC (signal acquisition component 3) are deactivated for the purpose of measuring nominal currents >40 A. The three phase currents are detected via external sensor elements (current transformer, shunt, Rogowski coil) and forwarded to the assigned inputs (of the connecting device 10) of the signal acquisition component 3 which is embodied as an ASIC.

Voltage measuring is effected by way of capacitive voltage sensors 5 in the printed circuit board 1. The associated conductor potential phases 2 are connected to the line voltage of the installation via external terminals.

In addition to voltage measurement via capacitive sensor areas electrically isolated from the main power circuit, the signal acquisition component 3 preferably also offers the possibility of processing non-floating voltage signals (obtained from the line voltage using ohmic voltage dividers). Direct capacitive voltage measurement is, however, by far the most economical and most space-saving solution.

Figure 5:
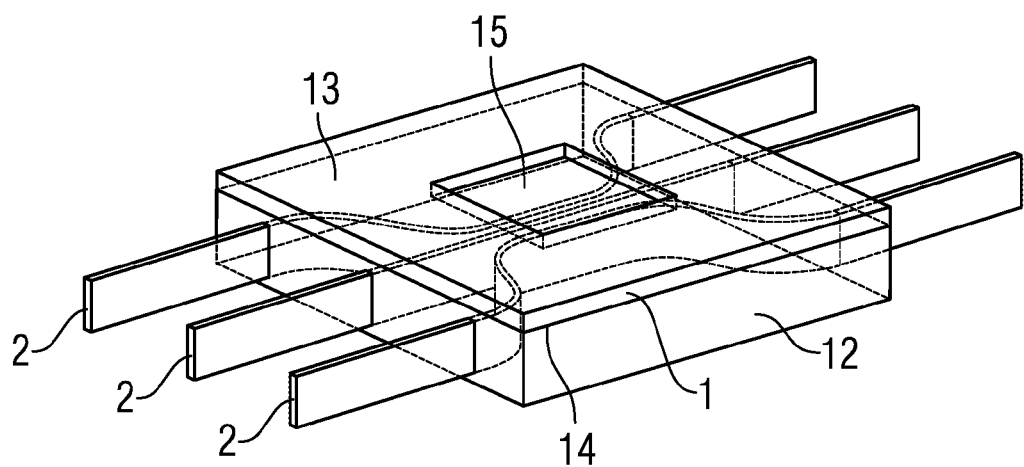
FIG. 5 is a perspective view of a part of the embodiment variant shown in FIG. 3.

FIG. 5 is a perspective view of a part of the embodiment variant shown in FIG. 3. Particularly apparent therein is how the three phases 2 are routed. The three phases are routed in the insulating block 12, which is mounted beneath the printed circuit board 1 (on the second lateral surface 14), to the recess 15, which is disposed on the first lateral surface 13 of the printed circuit board 1. The signal acquisition component is positioned inside said recess 15 so that the distance between the current sensors and the individual phases 2 will be kept as small as possible. The phase routing is bundled in the region of the recess 15 (the region of the insulating block 12 covered by the recess 15), meaning that the phases 2 are disposed closer together inside the insulating block 12 in the region of the recess 15 than outside the region covered by the recess 15. The individual voltage sensors can be positioned both beneath the region formed by the recess 15 and, preferably, outside the region formed by the recess inside the printed circuit board 1.

The invention claimed is:

1. A measuring system for monitoring at least one lead of a system, the measuring system comprising:
 a measuring module arranged on a printed circuit board, the measuring module including a signal acquisition component and a signal processing component, the signal acquisition component being embodied by an Application-Specific-Integrated-Circuit (ASIC), and being connected to the signal processing component; wherein
 the printed circuit board includes a voltage sensor corresponding to each of the at least one lead to be monitored,
 for each of the at least one lead to be monitored, the signal acquisition component includes at least a corresponding pair of current sensors and a voltage sensor terminal electrically connected to the corresponding voltage sensor,
 in a plan view, each of the at least one lead to be monitored has a current sensor from among the corresponding pair current sensors arranged at each side of the at least one lead to be monitored,
 the measuring system is configured to determine, for each of the at least one lead to be monitored, a current value via the corresponding pair of current sensors, and to determine a voltage value of each of the at least one lead to be monitored via the corresponding voltage sensor,
 the signal processing component is configured to evaluate the determined current and voltage values, and
 the signal processing component includes at least one output device configured to output control data and digital control signals.

2. The measuring system of claim 1, wherein the corresponding pair of current sensors are current-measuring Hall-effect sensors integrated in the ASIC.

3. The measuring system of claim 2, wherein the corresponding voltage sensor is arranged outside an area of the printed circuit board covered by the signal acquisition component.

4. The measuring system of claim 2, wherein the corresponding voltage sensor is arranged inside the printed circuit board.

5. The measuring system of claim 2, wherein the corresponding voltage sensor is a capacitive voltage sensor.

6. The measuring system of claim 1, wherein the corresponding voltage sensor is arranged outside an area of the printed circuit board covered by the signal acquisition component.

7. The measuring system of claim 1, wherein the corresponding voltage sensor is arranged inside the printed circuit board.

8. The measuring system of claim 1, wherein the corresponding voltage sensor is a capacitive voltage sensor.

9. The measuring system of claim 1, wherein each of the at least one lead to be monitored is electrically isolated from the corresponding pair of current sensors and voltage sensor terminal.

10. The measuring system of claim 1, wherein the measuring system is configured to monitor a system having at least three leads.

11. The measuring system of claim 1, wherein the measuring module further comprises:
 at least one connecting device configured to connect the measuring module to an external current sensor, the external current sensor being external to the measuring module, and being configured to determine a current value of the at least one lead of the system.

12. The measuring system of claim 1, wherein
 the measuring module is configured to determine at least one parameter, the at least one parameter including at least one of a power factor, an effective power, an apparent power, a reactive power and a value characterizing at least one of the power factor, the effective power, the apparent power and the reactive power in terms of the at least one lead; and
 the measuring module is configured to output the determined at least one parameter via the at least one output device.

13. The measuring system of claim 1, wherein
 the signal processing component is configured to, based on at least one of the determined current and voltage values, determine at least one of an overload and a short-circuit of an installation supplied via the at least one lead; and
 the at least one output device is configured to output a signal characterizing at least one of the overload and short.

14. The measuring system of claim 1, wherein the ASIC further includes the signal processing component.

15. The measuring system of claim 1, further comprising:
 a parameterizing device configured to control activation and deactivation of at least one of (i) the corresponding voltage sensor, (ii) the voltage sensor terminal, and (iii) at least one of the corresponding pair of current sensors.

16. The measuring system of claim 1, wherein
 the at least one lead is routed in the printed circuit board; and
 the signal acquisition component is on the printed circuit board below the signal acquisition component.

17. A load feeder comprising:
 the measuring system of claim 1, the measuring system being configured to monitor at least one lead of the load feeder.

18. A measuring system for monitoring at least one lead of a system, the measuring system comprising:
- a measuring module arranged on a printed circuit board, the measuring module including a signal acquisition component and a signal processing component, the signal acquisition component being embodied by an Application-Specific-Integrated-Circuit (ASIC), and being connected to the signal processing component; wherein
- the printed circuit board includes a voltage sensor for each of the at least one leads to be monitored,
- for each of the at least one lead to be monitored, the signal acquisition component includes at least two current sensors and a voltage sensor terminal electrically connected to the voltage sensor,
- the measuring system is configured to determine a current value via the at least two current sensors, and to determine a voltage value of the at least one lead to be monitored via the voltage sensor,
- the signal processing component is configured to evaluate the determined current and voltage values,
- the signal processing component includes at least one output device configured to output serial control data and digital control signals,
- the measuring system includes an insulating block in which the at least one lead is routed,
- the printed circuit board includes a first and a second lateral surface, the first lateral surface being opposite to the second lateral surface,
- the signal acquisition component is arranged on the first lateral surface,
- the insulating block is arranged on the second lateral surface, and
- the signal acquisition component is positioned opposite the insulating block on the printed circuit board such that the at least one lead is routed beneath the signal acquisition component.

19. The measuring system of claim 18, wherein the first lateral surface includes a recess so that the signal acquisition component is at least partially integrated in the printed circuit board.

* * * * *